US006621853B1

United States Patent
Ku

(10) Patent No.: US 6,621,853 B1
(45) Date of Patent: Sep. 16, 2003

(54) FREQUENCY SYNTHESIZING DEVICE AND METHOD FOR DUAL FREQUENCY HOPPING WITH FAST LOCK TIME

(75) Inventor: Do-Il Ku, Yongin-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/385,708

(22) Filed: Aug. 30, 1999

(30) Foreign Application Priority Data

Aug. 28, 1998 (KR) ............................................. 98-35120
Dec. 10, 1998 (KR) ............................................. 98-54139

(51) Int. Cl.⁷ ............................................... H04B 1/713
(52) U.S. Cl. .......................................... 375/132; 455/76
(58) Field of Search ................................. 375/132, 219, 375/133, 134; 455/76, 86

(56) References Cited

U.S. PATENT DOCUMENTS

| 6,009,313 A | * | 12/1999 | Ichiyoshi | ..................... 455/76 |
| 6,028,850 A | * | 2/2000 | Kang | .......................... 370/320 |
| 6,061,575 A | * | 5/2000 | Lombardi | .................... 455/552 |

* cited by examiner

*Primary Examiner*—Don N. Vo
*Assistant Examiner*—Dung X Nguyen
(74) *Attorney, Agent, or Firm*—Dilworth & Barrese, LLP

(57) ABSTRACT

A dual-frequency hopping device and method for a frequency synthesizer. An intermediate local oscillating frequency is decreased in the unit of a first frequency by a prescribed number of times as a channel is sequentially increased, to output an intermediate local oscillating frequency signal. A radio local oscillating frequency is increased by one level in the unit of a second frequency when the intermediate local oscillating frequency is decreased by the prescribed number of times, to output a radio local oscillating frequency signal.

18 Claims, 5 Drawing Sheets

| Ch. | TX fc | TX IFLO | TX IF | TX RFLO | Rx fc | RX IFLO | RX IFLO2 | RX RFLO | RX 1st IF | RF 2nd IF |
|---|---|---|---|---|---|---|---|---|---|---|
| 1 | 1985.025 | 430.200 | 215.100 | 2200.125 | 2170.025 | 456.200 | 228.100 | 2385.125 | 215.100 | 13.000 |
| 2 | 1985.050 | 430.150 | 215.075 | 2200.125 | 2170.050 | 456.150 | 228.075 | 2385.125 | 215.075 | 13.000 |
| 3 | 1985.075 | 430.100 | 215.050 | 2200.125 | 2170.075 | 456.100 | 228.050 | 2385.125 | 215.050 | 13.000 |
| 4 | 1985.100 | 430.050 | 215.025 | 2200.125 | 2170.100 | 456.050 | 228.025 | 2385.125 | 215.025 | 13.000 |
| 5 | 1985.125 | 430.000 | 215.000 | 2200.125 | 2170.125 | 456.000 | 228.000 | 2385.125 | 215.000 | 13.000 |
| 6 | 1985.150 | 430.200 | 215.100 | 2200.250 | 2170.150 | 456.200 | 228.100 | 2385.250 | 215.100 | 13.000 |
| 7 | 1985.175 | 430.150 | 215.075 | 2200.250 | 2170.175 | 456.150 | 228.075 | 2385.250 | 215.075 | 13.000 |
| 8 | 1985.200 | 430.100 | 215.050 | 2200.250 | 2170.200 | 456.100 | 228.050 | 2385.250 | 215.050 | 13.000 |
| 9 | 1985.225 | 430.050 | 215.025 | 2200.250 | 2170.225 | 456.050 | 228.025 | 2385.250 | 215.025 | 13.000 |
| 10 | 1985.250 | 430.000 | 215.000 | 2200.250 | 2170.250 | 456.000 | 228.000 | 2385.250 | 215.000 | 13.000 |
| 11 | 1985.275 | 430.200 | 215.100 | 2200.375 | 2170.275 | 456.200 | 228.100 | 2385.375 | 215.100 | 13.000 |
| 12 | 1985.300 | 430.150 | 215.075 | 2200.375 | 2170.300 | 456.150 | 228.075 | 2385.375 | 215.075 | 13.000 |
| 13 | 1985.325 | 430.100 | 215.050 | 2200.375 | 2170.325 | 456.100 | 228.050 | 2385.375 | 215.050 | 13.000 |
| 14 | 1985.350 | 430.050 | 215.025 | 2200.375 | 2170.350 | 456.050 | 228.025 | 2385.375 | 215.025 | 13.000 |
| 15 | 1985.375 | 430.000 | 215.000 | 2200.375 | 2170.375 | 456.000 | 228.000 | 2385.375 | 215.000 | 13.000 |
| 16 | 1985.400 | 430.200 | 215.100 | 2200.500 | 2170.400 | 456.200 | 228.100 | 2385.500 | 215.100 | 13.000 |
| 17 | 1985.425 | 430.150 | 215.075 | 2200.500 | 2170.425 | 456.150 | 228.075 | 2385.500 | 215.075 | 13.000 |
| 18 | 1985.450 | 430.100 | 215.050 | 2200.500 | 2170.450 | 456.100 | 228.050 | 2385.500 | 215.050 | 13.000 |
| 19 | 1985.475 | 430.050 | 215.025 | 2200.500 | 2170.475 | 456.050 | 228.025 | 2385.500 | 215.025 | 13.000 |
| 20 | 1985.600 | 430.000 | 215.000 | 2200.500 | 2170.500 | 456.000 | 228.000 | 2385.500 | 215.000 | 13.000 |
| 1181 | 2014.525 | 430.200 | 215.100 | 2229.625 | 2199.525 | 456.200 | 228.100 | 2414.625 | 215.100 | 13.000 |
| 1182 | 2014.550 | 430.150 | 215.075 | 2229.625 | 2199.550 | 456.150 | 228.075 | 2414.625 | 215.075 | 13.000 |
| 1183 | 2014.575 | 430.100 | 215.050 | 2229.625 | 2199.575 | 456.100 | 228.050 | 2414.625 | 215.050 | 13.000 |
| 1184 | 2014.600 | 430.050 | 215.025 | 2229.625 | 2199.600 | 456.050 | 228.025 | 2414.625 | 215.025 | 13.000 |
| 1185 | 2014.625 | 430.000 | 215.000 | 2229.625 | 2199.625 | 456.000 | 228.000 | 2414.625 | 215.000 | 13.000 |
| 1186 | 2014.650 | 430.200 | 215.100 | 2229.750 | 2199.650 | 456.200 | 228.100 | 2414.750 | 215.100 | 13.000 |
| 1187 | 2014.675 | 430.150 | 215.075 | 2229.750 | 2199.675 | 456.150 | 228.075 | 2414.750 | 215.075 | 13.000 |
| 1188 | 2014.700 | 430.100 | 215.050 | 2229.750 | 2199.700 | 456.100 | 228.050 | 2414.750 | 215.050 | 13.000 |
| 1189 | 2014.725 | 430.050 | 215.025 | 2229.750 | 2199.725 | 456.050 | 228.025 | 2414.750 | 215.025 | 13.000 |
| 1190 | 2014.750 | 430.000 | 215.000 | 2229.750 | 2199.750 | 456.000 | 228.000 | 2414.750 | 215.000 | 13.000 |
| 1191 | 2014.775 | 430.200 | 215.100 | 2229.875 | 2199.775 | 456.200 | 228.100 | 2414.875 | 215.100 | 13.000 |
| 1192 | 2014.800 | 430.150 | 215.075 | 2229.875 | 2199.800 | 456.150 | 228.075 | 2414.875 | 215.075 | 13.000 |
| 1193 | 2014.825 | 430.100 | 215.050 | 2229.875 | 2199.825 | 456.100 | 228.050 | 2414.875 | 215.050 | 13.000 |
| 1194 | 2014.850 | 430.050 | 215.025 | 2229.875 | 2199.850 | 456.050 | 228.025 | 2414.875 | 215.025 | 13.000 |
| 1195 | 2014.875 | 430.000 | 215.000 | 2229.875 | 2199.875 | 456.000 | 228.000 | 2414.875 | 215.000 | 13.000 |
| 1196 | 2014.900 | 430.200 | 215.100 | 2230.000 | 2199.900 | 456.200 | 228.100 | 2415.000 | 215.100 | 13.000 |
| 1197 | 2014.925 | 430.150 | 215.075 | 2230.000 | 2199.925 | 456.150 | 228.075 | 2415.000 | 215.075 | 13.000 |
| 1198 | 2014.950 | 430.100 | 215.050 | 2230.000 | 2199.950 | 456.100 | 228.050 | 2415.000 | 215.050 | 13.000 |
| 1199 | 2014.875 | 430.050 | 215.025 | 2230.000 | 2199.975 | 456.050 | 228.025 | 2415.000 | 215.025 | 13.000 |

FIG. 3

| | TX PART | | | | RX PART | | | | |
|---|---|---|---|---|---|---|---|---|---|---|
| Ch. | TX fc | TX IFLO | TX IF | TX RFLO | Rx fc | RX RFLO | RX 1st IF | RX IFLO | RX IFLO | RX 2nd IF |
| 1 | 1985.025 | 548.050 | 274.025 | 2259.050 | 2170.025 | 2320.050 | 150.025 | 548.100 | 137.025 | 13.000 |
| 2 | 1985.050 | 548.000 | 274.000 | 2259.050 | 2170.050 | 2320.050 | 150.000 | 548.000 | 137.000 | 13.000 |
| 3 | 1985.075 | 548.050 | 274.025 | 2259.100 | 2170.075 | 2320.100 | 150.025 | 548.100 | 137.025 | 13.000 |
| 4 | 1985.100 | 548.000 | 274.000 | 2259.100 | 2170.100 | 2320.100 | 150.000 | 548.000 | 137.000 | 13.000 |
| 5 | 1985.125 | 548.050 | 274.025 | 2259.150 | 2170.125 | 2320.150 | 150.025 | 548.100 | 137.025 | 13.000 |
| 6 | 1985.150 | 548.000 | 274.000 | 2259.150 | 2170.150 | 2320.150 | 150.000 | 548.000 | 137.000 | 13.000 |
| 7 | 1985.175 | 548.050 | 274.025 | 2259.200 | 2170.175 | 2320.200 | 150.025 | 548.100 | 137.025 | 13.000 |
| 8 | 1985.200 | 548.000 | 274.000 | 2259.200 | 2170.200 | 2320.200 | 150.000 | 548.000 | 137.000 | 13.000 |
| 9 | 1985.225 | 548.050 | 274.025 | 2259.250 | 2170.225 | 2320.250 | 150.025 | 548.100 | 137.025 | 13.000 |
| 10 | 1985.250 | 548.000 | 274.000 | 2259.250 | 2170.250 | 2320.250 | 150.000 | 548.000 | 137.000 | 13.000 |
| 11 | 1985.275 | 548.050 | 274.025 | 2259.300 | 2170.275 | 2320.300 | 150.025 | 548.100 | 137.025 | 13.000 |
| 12 | 1985.300 | 548.000 | 274.000 | 2259.300 | 2170.300 | 2320.300 | 150.000 | 548.000 | 137.000 | 13.000 |
| 13 | 1985.325 | 548.050 | 274.025 | 2259.350 | 2170.325 | 2320.350 | 150.025 | 548.100 | 137.025 | 13.000 |
| 14 | 1985.350 | 548.000 | 274.000 | 2259.350 | 2170.350 | 2320.350 | 150.000 | 548.000 | 137.000 | 13.000 |
| 15 | 1985.375 | 548.050 | 274.025 | 2259.400 | 2170.375 | 2320.400 | 150.025 | 548.100 | 137.025 | 13.000 |
| 16 | 1985.400 | 548.000 | 274.000 | 2259.400 | 2170.400 | 2320.400 | 150.000 | 548.000 | 137.000 | 13.000 |
| 17 | 1985.425 | 548.050 | 274.025 | 2259.450 | 2170.425 | 2320.450 | 150.025 | 548.100 | 137.025 | 13.000 |
| 18 | 1985.450 | 548.000 | 274.000 | 2259.450 | 2170.450 | 2320.450 | 150.000 | 548.000' | 137.000 | 13.000 |
| 19 | 1985.475 | 548.050 | 274.025 | 2259.500 | 2170.475 | 2320.500 | 150.025 | 548.100 | 137.025 | 13.000 |
| 20 | 1985.500 | 548.000 | 274.000 | 2259.500 | 2170.500 | 2320.500 | 150.000 | 548.000 | 137.000 | 13.000 |
| 1181 | 2014.525 | 548.050 | 274.025 | 2288.550 | 2199.525 | 2349.550 | 150.025 | 548.100 | 137.025 | 13.000 |
| 1182 | 2014.550 | 548.000 | 274.000 | 2288.550 | 2199.550 | 2349.550 | 150.000 | 548.000 | 137.000 | 13.000 |
| 1183 | 2014.575 | 548.050 | 274.025 | 2288.600 | 2199.575 | 2349.600 | 150.025 | 548.100 | 137.025 | 13.000 |
| 1184 | 2014.600 | 548.000 | 274.000 | 2288.600 | 2199.600 | 2349.600 | 150.000 | 548.000 | 137.000 | 13.000 |
| 1185 | 2014.625 | 548.050 | 274.025 | 2288.650 | 2199.625 | 2349.650 | 150.025 | 548.100 | 137.025 | 13.000 |
| 1186 | 2014.650 | 548.000 | 274.000 | 2288.650 | 2199.650 | 2349.650 | 150.000 | 548.000 | 137.000 | 13.000 |
| 1187 | 2014.675 | 548.050 | 274.025 | 2288.700 | 2199.675 | 2349.700 | 150.025 | 548.100 | 137.025 | 13.000 |
| 1188 | 2014.700 | 548.000 | 274.000 | 2288.700 | 2199.700 | 2349.700 | 150.000 | 548.000 | 137.000 | 13.000 |
| 1189 | 2014.725 | 548.050 | 274.025 | 2288.750 | 2199.725 | 2349.750 | 150.025 | 548.100 | 137.025 | 13.000 |
| 1190 | 2014.750 | 548.000 | 274.000 | 2288.750 | 2199.750 | 2349.750 | 150.000 | 548.000 | 137.000 | 13.000 |
| 1191 | 2014.775 | 548.050 | 274.025 | 2288.800 | 2199.775 | 2349.800 | 150.025 | 548.100 | 137.025 | 13.000 |
| 1192 | 2014.800 | 548.000 | 274.000 | 2288.800 | 2199.800 | 2349.800 | 150.000 | 548.000 | 137.000 | 13.000 |
| 1193 | 2014.825 | 548.050 | 274.025 | 2288.850 | 2199.825 | 2349.850 | 150.025 | 548.100 | 137.025 | 13.000 |
| 1194 | 2014.850 | 548.000 | 274.000 | 2288.850 | 2199.850 | 2349.850 | 150.000 | 548.000 | 137.000 | 13.000 |
| 1195 | 2014.875 | 548.050 | 274.025 | 2288.900 | 2199.875 | 2349.900 | 150.025 | 548.100 | 137.025 | 13.000 |
| 1196 | 2014.900 | 548.000 | 274.000 | 2288.900 | 2199.900 | 2349.900 | 150.000 | 548.000 | 137.000 | 13.000 |
| 1197 | 2014.925 | 548.050 | 274.025 | 2288.950 | 2199.925 | 2349.950 | 150.025 | 548.100 | 137.025 | 13.000 |
| 1198 | 2014.950 | 548.000 | 274.000 | 2288.950 | 2199.950 | 2349.950 | 150.000 | 548.000 | 137.000 | 13.000 |
| 1199 | 2014..975 | 548.050 | 274.025 | 2289.000 | 2199.975 | 2350.000 | 150.025 | 548.100 | 137.025 | 13.000 |

FIG. 5

FREQUENCY SYNTHESIZING DEVICE AND METHOD FOR DUAL FREQUENCY HOPPING WITH FAST LOCK TIME

BACKGROUND OF THE INVENTION

1. Field of the Invention

The present invention relates generally to mobile communication systems, and in particular, to a device and method for providing a fast lock time by hopping an intermediate frequency and a radio frequency.

2. Description of the Related Art

In general, radio communication systems include a frequency synthesizer having a phase locked loop (PLL). In a GMPCS (Global Mobile Personal Communication by Satellite) system, such as, iridium, global star and ICO (Intermediate Circuit Orbit), for example, the frequency synthesizer uses a dual frequency band frequency synthesizer. The frequency synthesizer used in the GMPCS system has a dual PLL which generates a radio local oscillating frequency and an intermediate local oscillating frequency. These two frequencies are used to convert an input signal frequency into a desired carrier frequency fc.

A frequency synthesizer typically comprises a reference oscillator, a phase detector, a loop filter, a voltage controlled oscillator (VCO), and a programmable counter.

In the dual PLL, a fractional N counter is used for the radio local oscillating frequency, and an integer N counter is used for the intermediate local oscillating frequency. The integer N counter consists of P (prescaler), B and A (programmable) counters satisfying the following equation $N=P \times B+A$ (where P, B and A are all integers). The fractional N counter includes an F (fractional) counter in addition to the P, B and A counters, satisfying the following equation $N=P \times B+A+F$ (where P, B and A are all integers, P, A, and F is a fractional number less than 1).

A frequency synthesizer having a general dual PLL construction uses a frequency division multiple access (FDMA) technique where each user is assigned a different frequency. To assign a frequency per channel (i.e., user) in the FDMA technique, the integer N counter and fractional N counter operate by 24-bit control data provided from a baseband circuit. The integer N counter provides a uniform frequency without frequency hopping under control of the baseband circuit to output one intermediate local oscillating frequency. The fractional N counter outputs a radio local oscillating frequency hopping in increments of a prescribed frequency according to the channel.

For example, in a transmitter of an ICO system, an intermediate local oscillating frequency of 430.0 MHZ is demultiplied by ½ and thus a 215.0 MHZ signal is applied to a mixer as an input representing the uniform frequency without frequency hopping. One of a number of radio local oscillating frequencies of $(2200+0.025 \times n)$ MHZ are spaced at 25 kHz increments is also applied to the mixer as another input. Therefore, the output of the mixer, that is, an ICO transmitting frequency is the difference of the two inputs, namely, $\{(2200+0.025 \times n)-215\}$MHZ$=(1985+0.025 \times n)$ MHZ, where n is an integral number, i.e., 1, 2, 3, 4, . . . , its bandwidth being 25 KHz. In a receiver of the ICO, the intermediate local oscillating frequency is preferably fixed at 456.0 MHZ and the radio local oscillating frequency is sequentially incremented (or hopped) in units of 25 KHz.

For a GMPCS system, the radio local oscillating frequency should be some multiple of 25 KHz because the frequency bandwidth of the GMPCS system is 25 KHz. If the radio local oscillating frequency is a multiple of 25 KHz, a phase detector of a PLL used for radio local oscillation should also use 25 KHz as a comparison frequency. Since the PLL used for radio local oscillation employs a fractional N counter with modulus-16, the maximum comparison frequency of the phase detector is 400 KHz (=25 KHz×16). The comparison frequency is an important factor in determining a lock time in designing a system, whereby the lock time becomes faster as the comparison frequency is increased. Generally, the GMPCS system has 1199 channels and a demanded lock time of 350 Fs. The more channels the system has, the faster the demanded lock time. A high comparison frequency is desirable to obtain a fast lock time.

As described above, it is difficult to flexibly change the comparison frequency to a desired frequency band (i.e., higher frequency), so it is impossible to achieve a faster lock time. Namely, since the intermediate local oscillating frequency is fixed, the comparison frequency range is limited to, for example, 25 KHz (mod. 16/16), 50 KHz (mod. 8/16), 100 KHz (mod. 4/16) and 400 KHz (mod.1/16). Also, the lock time and phase noise are influenced by the comparison frequency. However, since the range of generating the comparison frequency is restricted, it is difficult to provide a fast lock time.

SUMMARY OF THE INVENTION

It is, therefore, an object of the present invention to provide a dual frequency hopping device and method for a frequency synthesizer, in which an intermediate local oscillating frequency hops per channel in increments defined by a first prescribed frequency, and a radio local oscillating frequency hops in increments defined by a second prescribed frequency only after the intermediate local oscillating frequency reaches a target frequency, thereby fully utilizing an RF channel band.

In accordance with one embodiment of the present invention, a dual-frequency hopping method for a frequency synthesizer having a dual phase locked loop includes the steps of decreasing an intermediate local oscillating frequency in increments defined by a first prescribed frequency a prescribed number of times as a channel is sequentially increased, to output an intermediate local oscillating frequency signal, and increasing a radio local oscillating frequency by one level in units of a second prescribed frequency after the intermediate local oscillating frequency has been decreased the prescribed number of times, to output a radio local oscillating frequency signal.

In accordance with a second embodiment of the present invention, a dual-frequency hopping device for a frequency synthesizer having a baseband processor and a reference frequency generator are provided for generating a reference frequency signal under control of the baseband processor. The dual-frequency hopping device further includes an intermediate frequency local oscillator for demultiplying the reference frequency signal and decreasing an intermediate local oscillating frequency a prescribed number of times in increments of a first prescribed frequency as a channel is sequentially increased, and a radio frequency local oscillator for demultiplying the reference frequency and increasing a radio local oscillating frequency in increments of a second prescribed frequency after the intermediate local oscillating frequency has been decreased the prescribed number of times.

BRIEF DESCRIPTION OF THE DRAWINGS

The above and other objects, features and advantages of the present invention will become more apparent from the following detailed description when taken in conjunction with the accompanying drawings in which like reference numerals designate like or corresponding parts throughout several views, and in which:

FIG. 3 is a diagram showing a frequency plan according to the first embodiment of the present invention;

FIG. 5 is a diagram showing a frequency plan according to the second embodiment of the present invention.

DETAILED DESCRIPTION OF THE PREFERRED EMBODIMENT

Figure 1:
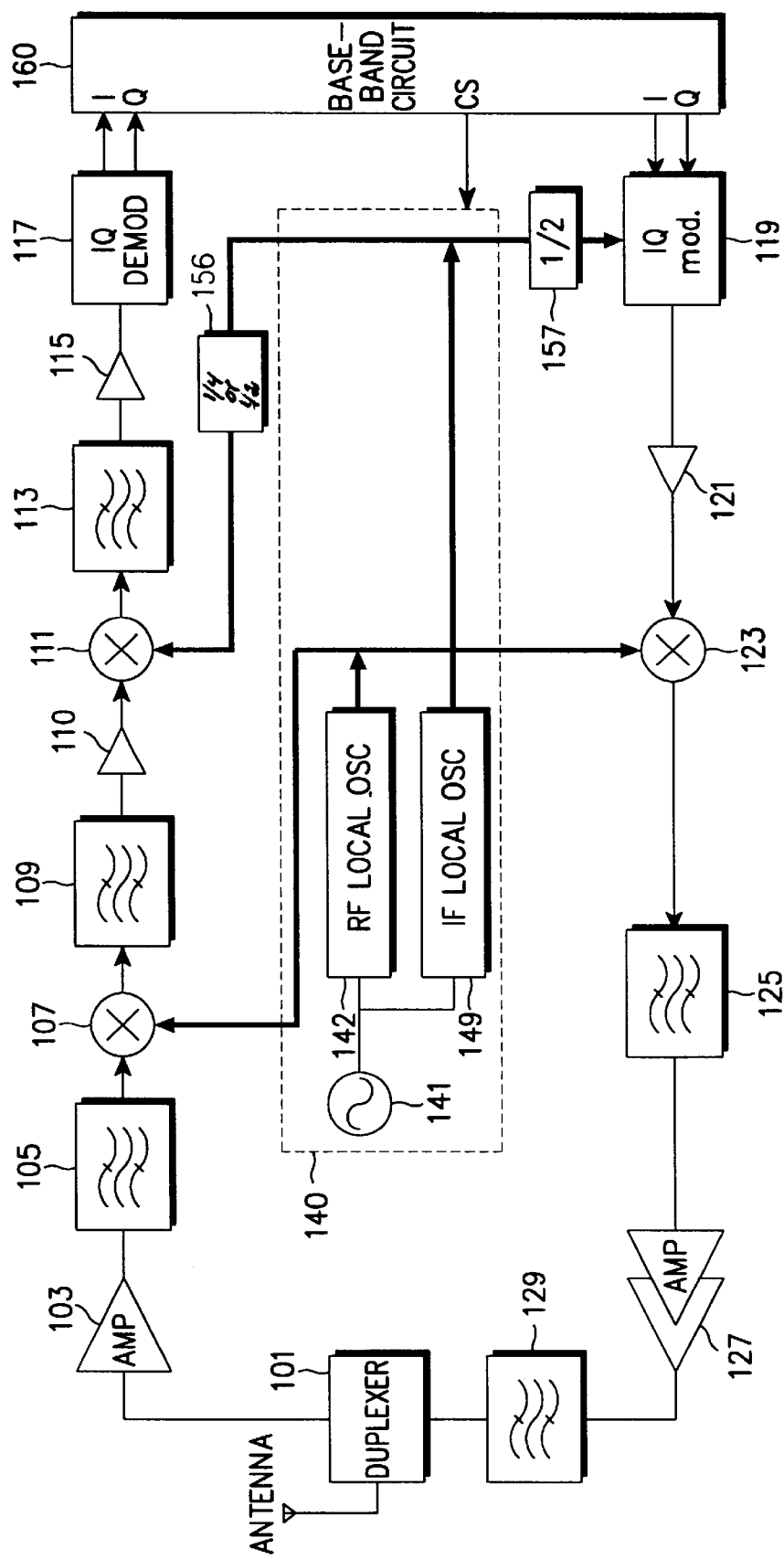
FIG. 1 is a block diagram of an RF circuit to which the present invention is applicable.

Preferred embodiments of the present invention will be described herein below with reference to the accompanying drawings. In the following description, well known constructions or functions are not described in detail so as not to obscure the present invention.

A. First Embodiment

A description of a frequency receiving path of an RF circuit will be given with reference to FIG. 1. A common antenna is shown which requires the use of a duplexer 101 to provide isolation means for RF signals transmitted and received through the antenna. A low-noise amplifier 103 low-noise amplifies a received RF signal output from the duplexer 101. The amplified signal then passes through a first receiving bandpass filter (BPF) 105 and the output of the BPF is mixed by a first mixer 107 with a first local oscillating radio frequency signal (RX RFLO) output from a frequency synthesizer 140 to output a first receiving intermediate frequency (RX 1st IF) signal. A second receiving BPF 109 bandpass filters the RX 1 ST IF signal. The RX $1^{st}$ IF signal output from the second receiving BPF 109 is then amplified by a first receiving amplifier 110 and provided as a first input to a second mixer 111. The second mixer 111 mixes the amplified RX $1^{st}$ signal with a second local oscillating frequency signal output from a demultiplier 156 to output a baseband signal (i.e., a second receiving IF signal (RX 2nd IF) which is 13 MHZ in the GMPCS system. The baseband signal is supplied to an in-phase/quadrature (IQ) demodulator 117 via a third receiving BPF 113 and a second receiving amplifier 115. The in-phase/quadrature demodulator 117 demodulates the baseband signal (RX $2^{nd}$ IF) into in-phase data and quadrature data.

A baseband circuit 160 receives the in-phase data and quadrature data from the in-phase/quadrature demodulator 117 and provides in-phase data and quadrature data to an in-phase/quadrature modulator 119. The baseband circuit 160 also supplies a 24-bit control signal (CS) to the frequency synthesizer 140 to determine a radio local oscillating frequency and intermediate local oscillating frequency of the frequency synthesizer 140.

A description of a frequency transmitting path will now be given with reference to FIG. 1. On a frequency transmitting path, the in-phase/quadrature modulator 119 modulates the prescribed in-phase data and quadrature data into a baseband signal and receives the second local oscillating frequency signal via a ½ demultiplier 157 to output a transmitting IF signal (TX IF). The transmitting IF signal is amplified by a first transmitting amplifier 121 and supplied to a third mixer 123. The third mixer 123 mixes the amplified IF signal with the first local oscillating frequency signal to output a transmitting RF signal (TX fc) ranging from 1985.0225 MHZ to 2014.975 MHZ with a bandwidth of 25 KHz per channel. The RF signal is supplied to the duplexer 101 via a transmitting BPF 125, a power amplifier 127 and a lowpass filter (LPF) 129. The RF signal (TX fc) is isolated from a received RF signal by the duplexer 101 and transmitted via the antenna.

The frequency synthesizer 140 generates the first local oscillating frequency signal (RX RFLO) to be supplied to the first mixer 107 and the third mixer 123, and further generates an intermediate (second) local oscillating frequency signal (RX IFLO) to be supplied to the second mixer 111 via the demultiplier 156 and to the in-phase/quadrature modulator 119 via the ½ demultiplier 157.

The frequency synthesizer 140 includes a reference frequency generator 141, an IF local oscillator 149 and an RF local oscillator 142. In the embodiments described herein, the reference frequency generator 141 generating the reference frequency signal is a VCTCXO (Voltage Controlled Temperature Compensated Crystal Oscillator). The IF local oscillator 149 demultiplies the reference frequency signal and generates an intermediate local oscillating frequency signal, which hops at a small predefined frequency increment. The process of hopping the intermediate local oscillating frequency repeats as the channel is sequentially increased. The RF local oscillator 142 demultiplies the reference at a frequency signal and generates radio local oscillating frequency signal which hops at high frequency increments after the intermediate local oscillating frequency signal has hopped a prescribed number of times. This process is also repeated as the channel is sequentially increased.

Figure 2:
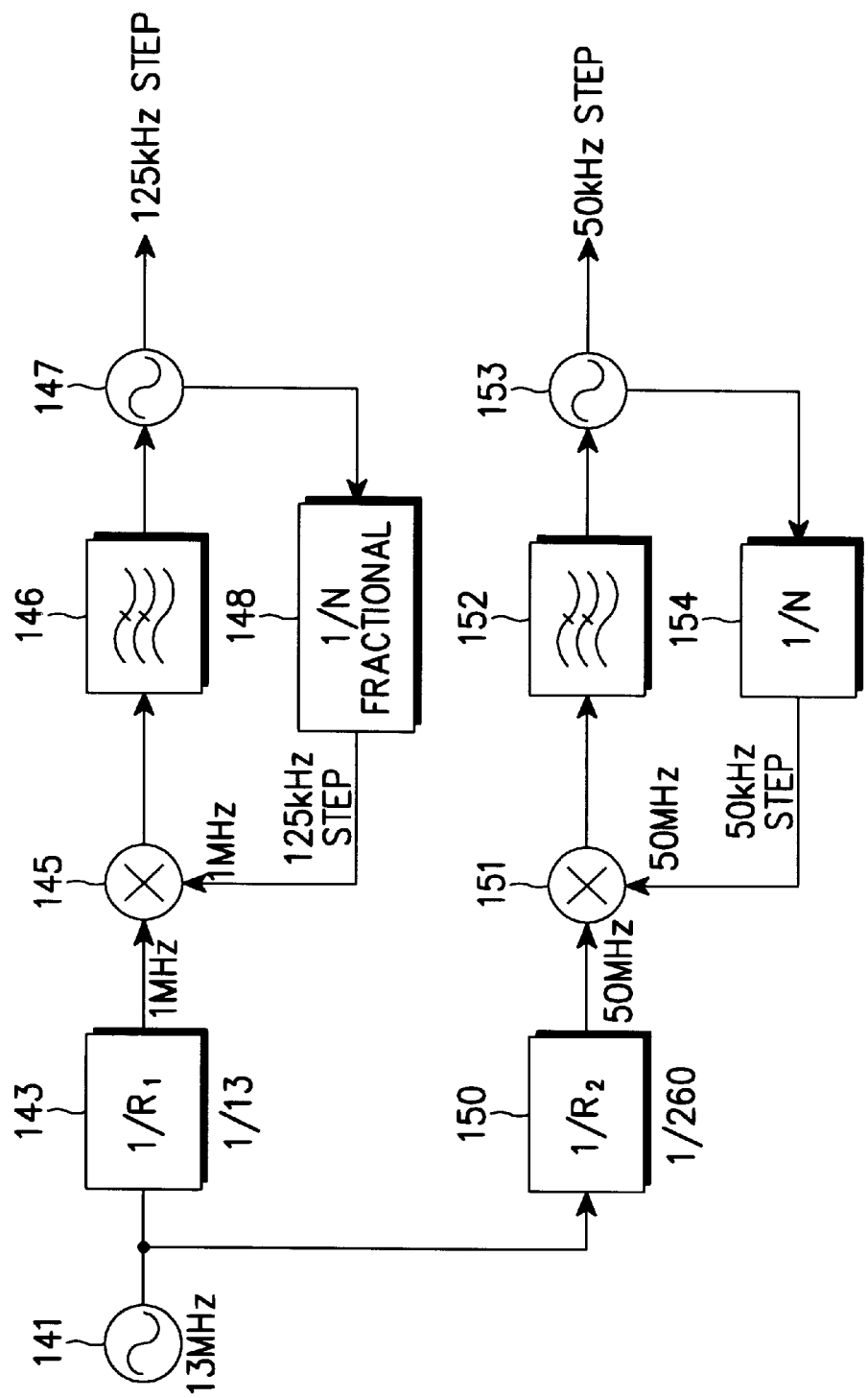
FIG. 2 is a block diagram of a frequency synthesizer according to a first embodiment of the present invention.

FIG. 2 is a detailed block diagram of the frequency synthesizer 140 shown in FIG. 1. The frequency values provided are exemplary and given with reference to a GMPCS system.

Referring to FIG. 2, a second demultiplier ($1/R_1$ demultiplier) 143, a second phase detector 145, a second loop filter (RF filter) 146, an RF VCO 147, and a second programmable counter (fractional N1 counter) 148 constitute the RF local oscillator 142 shown in FIG. 1. The second demultiplier 143 demultiplies the reference frequency signal supplied by the reference frequency generator 141 by $1/R_1$ (where $R_1$ is 13 in the GMPCS system). The RF VCO 147 receives a predetermined signal and provides as output an RF signal, ranging from 2200.125 MHZ to 2230.0 MHZ during transmission and from 2385.125 MHZ to 2415.0 MHZ during reception.

The fractional N1 counter 148 fractions or changes the oscillating frequency signal in units of 125 KHz under control of the baseband circuit 160. The second loop filter 146 lowpass filters the output of the second phase detector 145 and determines a synchronization characteristic or response characteristic which represents the characteristic of the lock time and phase noise. The second phase detector 145 compares the phase of a signal output from the second demultiplier 143 with the phase of a signal output from the second programmable counter 148. If these two phases are the same, the second phase detector 145 supplies a radio local oscillating frequency signal (TX RFLO) to the RF VCO 147 via the second loop filter 146. If they are not the same phase, then there is no locking for the phase.

Also shown in FIG. 2 is a detailed block diagram of the IF local oscillator 149 shown in FIG. 1. The IF local oscillator 149 shown in FIG. 1 is comprised of a first demultiplier (1/R2 demultiplier) 150, a first phase detector 151, a first loop filter (IF filter) 152, an IF VCO 153, and a first programmable counter 154. Its operation will be described below.

The first demultiplier 150 demultiplies the reference frequency signal by 1/R2 (where R2 is 260 in the GMPCS system). The IF VCO 153 receives a predetermined signal and outputs an IF signal. The first programmable counter 154 fractions the IF signal from the IF VCO 153 to a 50 KHz step under control of the baseband circuit 160. The first loop filter 152 lowpass filters the output of the first phase detector 151 and determines a synchronization characteristic or response characteristic. The first loop filter 152 controls the IF VCO 153 so as to output the intermediate local oscillating frequency signal. The first phase detector 151 compares the phase of a signal output from the first demultiplier 150 with the phase of a signal output from the first programmable counter 154. If these two phases are the same, the first phase detector 151 provides a corresponding intermediate local oscillating frequency to the IF VCO 153 via the first loop filter 152.

The operation of the frequency synthesizer 140 of FIG. 1 for the first transmitting channel (TX Ch) will now be described with reference to FIGS. 2 and 3 for a GMPCS system. Reference will first be made to the upper half of FIG. 2 which describes the transmitting RF local oscillator portion of the frequency synthesizer 140, comprising elements 143–148. The reference frequency generator 141 generates a reference frequency signal of 13 MHZ in a GMPCS system which is demultiplied by a second demultiplier (1/R$_1$) 143 to 1/13, that is, to a 1 MHZ signal. The 1 MHZ signal is applied as an input to the second phase detector 145. The second input to the second phase detector 145 is supplied by the second programmable counter (1/N) 148. That is, the RF VCO 147 outputs a transmitting radio local oscillating frequency signal (TX RFLO) at 2200.125 MHZ which is demultiplied by the second programmable counter 148 by a factor of 1/2200.125, that is, to a 1 MHZ signal. The 1 MHZ signal is applied as a second input to the second phase detector 145. If there is no phase difference between the two inputs, the phase detector 145 outputs the TX RFLO signal of 2200.125 MHZ as the output of the RF VCO 147 via the second loop filter 146.

The operation of the intermediate frequency (IF) local oscillator portion of the frequency synthesizer 140 comprising elements 150–154 for a GMPCS system will be provided. In FIG. 2, the 13 MHZ signal generated from the reference frequency generator 141 is demultiplied by the first demultiplier 150 by a factor of 1/260 to generate a 50 MHZ signal which is applied as a first input to the first phase detector 151. Meanwhile, a transmitting intermediate local oscillating frequency (TX IFLO) signal of 430.2 MHZ output from the IF VCO 153 is demultiplied by the first programmable counter (1/N) 154 by a factor of 1/8604 to generate a 50 MHZ signal which is applied a second input to the first phase detector 151. If there is no phase difference between the two inputs, the phase detector 151 outputs the TX IFLO signal as the output of the IF VCO 153 via the first loop filter 152.

The above-described operation is identically applied to a receiving part. Here, a receiving intermediate local oscillating frequency (RX IFLO) signal output from the IF VCO 153 is demultiplied by the demultiplier 156 to ½ and then output as an intermediate local oscillating frequency (RX IFLO2).

FIG. 3 illustrates the trequency plan for the radio local oscillating frequency and intermediate local oscillating frequency according to the channel.

As shown in the table of FIG. 3, the transmitting intermediate local oscillating frequency (TX IFLO) is different for each channel. That is, channels 1–6 transmit at the following TX IFLO frequencies: CH1=430.200 MHz; CH2=430.150 MHz; CH3=430.100 MHz; CH4=430.050 MHz; CH5=430.000 MHz; and CH6=430.200 MHz. As shown in the table, for channels 1–6, the TX IFLO is initialized at 430.200 for channel 1, and is then decremented four times by a 50 KHz step and then returns to the first channel frequency (i.e., 430.200) at the sixth channel. The corresponding transmitting radio local oscillating frequency (TX RFLO) is maintained at 2200.125 MHZ until the fifth channel and hops by a 125 KHz step to 2200.250 MHZ at the sixth channel. The frequency hopping method described is similarly applied to the receiving part.

The values for the radio local oscillating frequency and intermediate local oscillating frequency step sizes, (i.e., 125 KHz and 50 KHz, respectively), described with reference to FIGS. 1 and 2 may be modified and a comparison frequency of the PLL may have a larger value than a value used in the conventional system. Assuming that the RF circuit of a conventional GMPCS system uses a modulus-8 fractional N counter, the comparison frequency of the conventional RF local oscillator is limited to a value of 200 KHz, i.e., 25 KHz×8=200 KHz. By contrast, the comparison frequency of the RF local oscillator according to the present invention is up to 1 MHZ, i.e., 25 KHz×8×5=1 MHz.

To briefly summarize the first embodiment, the intermediate local oscillating frequency was decreased in four successive increments of 50 KHz and the radio local oscillating frequency was increased once by 125 KHz after being maintained at the same frequency for the four consecutive iterations. This process is cyclically repeated as shown in FIG. 3 for successive channel assignments (i.e., channels 1–6, 7–12, 13–18, etc.).

B. Second Embodiment

Figure 4:
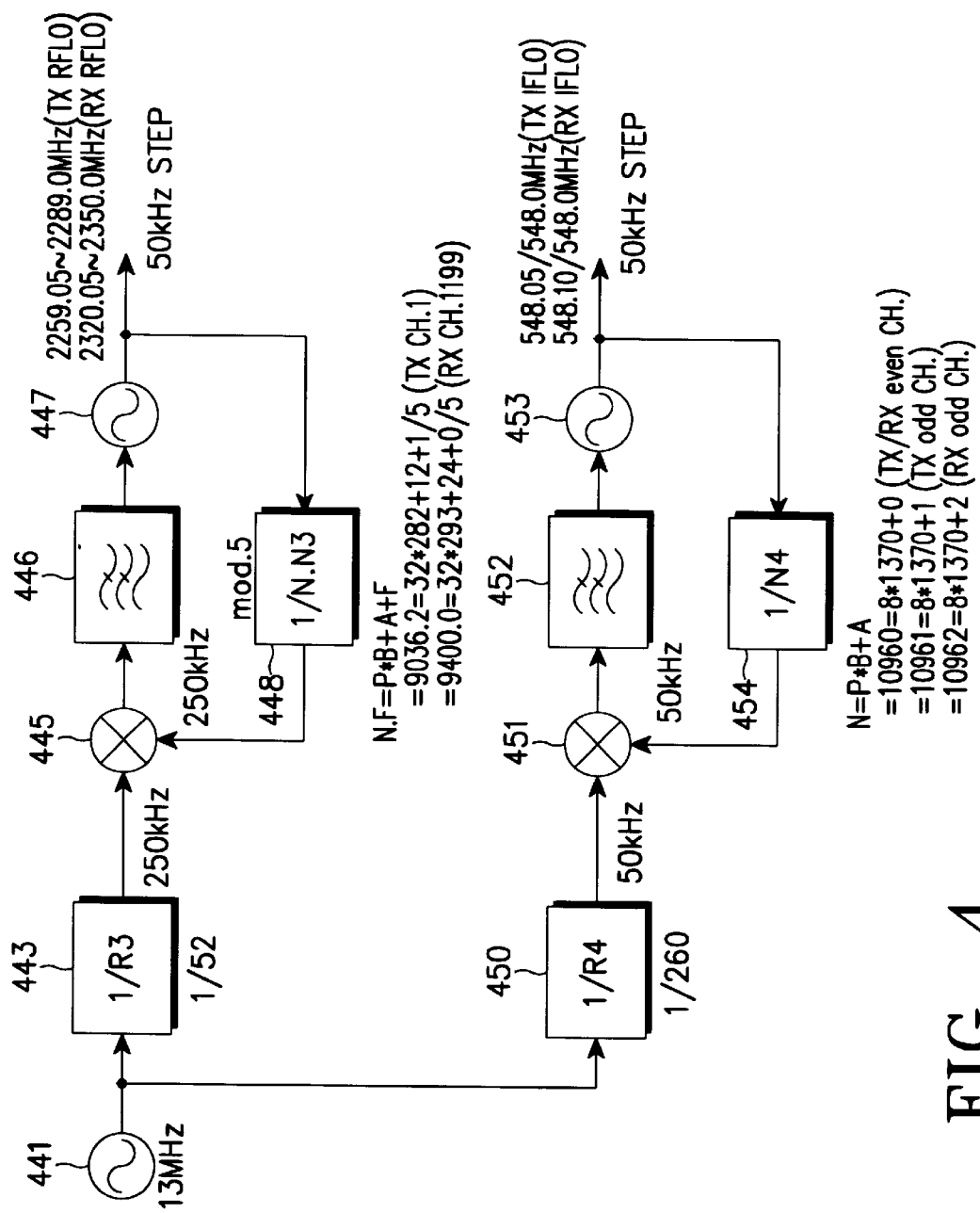
FIG. 4 is a block diagram of a frequency synthesizer according to a second embodiment of the present invention.

FIG. 4 is a block diagram of the frequency synthesizer according to a second embodiment of the present invention. In the second embodiment of the present invention, the intermediate local oscillating frequency is decreased twice, each time by 50 KHz and the radio local oscillating frequency is increased once by 50 KHz after being maintained at the same frequency for the two iterations in which the intermediate local oscillating frequency is decreased, thereby reducing a lock time of the frequency synthesizer.

Referring again to FIG. 1, the frequency synthesizer 140 according to the second embodiment of the present invention generates the transmitting and receiving radio local oscillating frequency signals to be supplied to the first mixer 107 and the third mixer 123, and generates the transmitting and receiving intermediate local oscillating frequency signals to be supplied to the second mixer 111 via the ¼ demultiplier 156 and to the in-phase/quadrature modulator 119 via the ½ demultiplier 157.

FIG. 4 is a block diagram of a frequency synthesizer according to a second embodiment of the present invention. Note that exemplary values are provided for a GMPCS system to facilitate understanding of the present embodiment. Referring to FIG. 4, the RF local oscillator 142 of FIG. 1 is comprised of elements 443–448; a 1/R3 demultiplier 443, a second phase detector 445, a second loop filter 446, an RF VCO 447, and a fractional N3 counter 448. The demultiplier 443 demultiplies the 13 MHZ signal generated from the reference frequency generator 141 by a factor of 1/R3 (where R3 is 52 in the GMPCS system), that is, to a 250 KHz signal. The RF VCO 447 receives a predetermined signal and outputs an RF signal ranging from 2259.05 MHZ to 2289.0 MHZ with a 50 KHz step during transmission and from 2320.05 MHZ to 2350.0 MHZ with a 50 KHz step during reception. This radio local oscillating frequency signal is applied to the first and third mixers 107 and 123 (see FIG. 1). The fractional N3 counter 448, which is a second programmable counter, fractions the radio local oscillating frequency output from the RF VCO 447 to a 250 KHz step under control of the baseband circuit 160. The second loop filter 446 lowpass filters the output of the second phase detector 445 and determines a synchronization or response characteristic. The second phase detector 445 compares the phase of a signal output from the second demultiplier 443 with the phase of a signal output from the second programmable counter 448. If they are the same, the second phase detector 145 supplies the radio local oscillating frequency to the RF VCO 447 via the loop filter 446.

The IF local oscillator 149 shown in FIG. 1 is comprised of a first demultiplier 450 (1/R4 demultiplier), a first phase detector 451, a first loop filter 452, an IF VCO 453, and a first programmable counter 454. The first demultiplier 450 demultiplies the reference frequency signal to 1/R4 (where R4 is 260). The IF VCO 453 receives a predetermined signal and oscillates to an IF signal. The first programmable counter 454 fractions the frequency signal oscillating from the IF VCO 153 to a 50 KHz step by the control of the baseband circuit 160. The IF filter 452 lowpass filters the output of the first phase detector 451 and determines a synchronization characteristic or response characteristic. The first loop filter 452 controls the IF VCO 453 so as to output the intermediate local oscillating frequency signal. The first phase detector 151 compares the phase of a signal output from the first demultiplier 450 with the phase of a signal output from the first programmable counter 454. If they are the same, the first phase detector 151 provides a corresponding intermediate local oscillating frequency signal to the IF VCO 453 via the first loop filter 452.

The operation of the frequency synthesizer for the first transmitting channel will now be described with reference to FIGS. 4 and 5 for a GMPCS system. The reference frequency generator 441 generates a 13 MHZ signal which is demultiplied by the second demultiplier 443 by a factor of 1/52, that is, to a 250 KHz signal. The 250 KHz signal is applied as a first input to the second phase detector 445. A 2259.05 MHZ signal output from the RF VCO 447 is demultiplied by the second programmable counter 448 by a factor of 1/9036.2, that is, to a 250 KHz signal. The 250 KHz signal is applied as a second input to the second phase detector 445. If there is no phase difference between the two inputs, the phase detector 445 outputs a transmitting radio local oscillating frequency of 2259.05 MHZ as the output of the RF VCO 447 via the second loop filter 446.

The reference frequency signal of 13 MHZ is also input to the first demultiplier 450 and demultiplied by the first demultiplier 450 by a factor of 1/260, that is, to a 50 KHz signal. The 50 KHz signal is applied as a first input to the first phase detector 451. A 548.05 MHZ signal output from the IF VCO 453 is demultiplied by the first programmable counter 454 by a factor of 1/10961, that is, to a 50 KHz signal. The 50 KHz signal is applied as a second input to the first phase detector 451. If there is no phase difference between the two inputs, the phase detector 451 outputs a transmitting intermediate local oscillating frequency as the output of the IF VCO 453 via the first loop filter 452. The above operation is identically applied to the receiving part.

Thus for the first transmitting channel, the transmitting radio local oscillating frequency (TX RFLO) signal of 2259.05 MHZ is provided to the third mixer 123 shown in FIG. 1, and the transmitting intermediate local oscillating frequency (TX IFLO) signal of 274.025 MHZ passing through the ½ demultiplier 157 is applied to the in-phase/quadrature modulator 119. The output of the third mixer 123 is a 1985.025 MHZ signal (=2259.05 MHZ–274.025 MHZ) which is the radio frequency signal (TX fc) for the first transmitting channel. The above operation is applied to the receiving part as well as other channels of the transmitting part. In the receiving part, the receiving intermediate local oscillating frequency (RX IFLO) signal is demultiplied by the demultiplier 156 to ¼ unlike the first embodiment, thereby decreasing a bandwidth of the RF VCO 447.

The transmitting intermediate local oscillating frequency (TX IFLO) is 548.05 MHZ for odd channels and 548.0 MHZ for even channels, as indicated in FIG. 5. The receiving intermediate local oscillating frequency (RX IFLO) is 548.1 MHZ for odd channels and 548.0 MHZ for even channels. The transmitting radio local oscillating frequency (TX RFLO) is unchanged for even channels and hops by a 50 KHz step for odd channels.

At the 1199-th receiving channel for example, the receiving RF (RX fc) signal of 2199.975 MHZ and the receiving radio local oscillating frequency (RX RFLO) signal of 2350.0 MHZ are applied to the first mixer 107, and the first receiving IF (RX 1st IF) signal of 150.025 KHz which is the difference there between is applied to the second mixer 111 as an input. The receiving intermediate local oscillating frequency (RX IFLO) signal of 548.1 MHZ is demultiplied by the demultiplier 156 to ¼, that is, to a 137.025 MHZ signal and output as a receiving intermediate local oscillating frequency (RX IFLO4) signal. The RX IFLO4 signal of 137.025 MHZ is applied to the second mixer 111 as another input. The second mixer 111 outputs a second IF (RX 2nd IF) signal of 13 MHZ.

It has been shown that a fast lock time is provided by hopping both the intermediate local oscillating frequency and radio local oscillating frequencies in the RF circuit. Further, the comparison frequency of the phase detector of the RF local oscillator is selectable and thus the frequency plan can be effectively designed.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A dual-frequency hopping method for a frequency synthesizer having a dual phase locked loop, comprising the steps of:

decreasing an intermediate local oscillating frequency an amount defined by a first frequency for a prescribed number of iterations, where each iteration corresponds to sequentially increasing a channel designation to output an intermediate local oscillating frequency signal at each iteration;

maintaining a radio local oscillating frequency for each iteration of said prescribed number of iterations except a last iteration to output a radio local oscillating frequency signal at each iteration; and increasing the radio local oscillating frequency by an amount defined by a second frequency at said last iteration to output a radio local oscillating frequency signal.

2. The method as claimed in claim 1, wherein the first frequency is 50 KHz.

3. The method as claimed in claim 1, wherein the prescribed number is 5.

4. The method as claimed in claim 1, wherein the second frequency is 25 KHz.

5. The method as claimed in claim 1, wherein the prescribed number is two.

6. The method as claimed in claim 1, wherein the second frequency is 50 KHz.

7. A dual-frequency hopping device for a frequency synthesizer having a baseband processor and a reference frequency generator for generating a reference frequency signal by the control of the baseband processor said reference frequency generator, comprising:

an intermediate frequency local oscillator for demultiplying the reference frequency signal and decreasing an intermediate local oscillating frequency for a prescribed number of iterations by an amount defined by a first frequency as a channel designation is sequentially increased; and a radio frequency local oscillator for demultiplying the reference frequency and increasing a radio local oscillating frequency by an amount defined by a second frequency subsequent to said intermediate local oscillating frequency being decreased for the prescribed number of iterations.

8. The method as claimed in claim 7, wherein the first frequency is 50 KHz.

9. The method as claimed in claim 7, wherein the prescribed number of iterations is 5.

10. The method as claimed in claim 7, wherein the second frequency is 25 Khz.

11. The method as claimed in claim 7, wherein the prescribed number of iterations is two.

12. The method as claimed in claim 7, wherein the second frequency is 50 KHz.

13. The device as claimed in claim 7, wherein the intermediate frequency local oscillator comprises:

a first demultiplier for demultiplying the reference frequency signal;

an intermediate frequency voltage controlled oscillator for receiving a prescribed signal and oscillating at an intermediate frequency signal in response to said prescribed signal;

a first programmable counter for demultiplying the oscillating frequency signal under control of the baseband processor;

an intermediate frequency loop filter for lowpass filtering an input signal to determine one of a synchronization characteristic and a response characteristic; and a first phase detector for comparing the phase of the signal output from the first demultiplier with the phase of the signal output from the first programmable counter and supplying an intermediate local oscillating frequency signal to the intermediate frequency voltage controlled oscillator via the intermediate frequency loop filter when the phases are determined to be equal.

14. The device as claimed in claim 7, wherein the radio frequency local oscillator comprises:

a second demultiplier for demultiplying the reference frequency signal;

a radio frequency voltage controlled oscillator for receiving a prescribed signal and oscillating at a radio frequency signal in response to said prescribed signal;

a second programmable counter for demultiplying the oscillating frequency signal by the control of the baseband processor;

a radio frequency loop filter for lowpass filtering an input signal to determine one of a synchronization characteristic and a response characteristic; and a second phase detector for comparing the phase of the signal output from the second demultiplier with the phase of the signal output from the second programmable counter and supplying a radio local oscillating frequency signal to the radio frequency voltage controlled oscillator via the radio frequency loop filter when the phases are determined to be equal.

15. A frequency generating method for a frequency synthesizer in a global Mobile Personal Communication by Satellite (GMPCS) system, comprising the steps of:

transmitting and receiving radio local oscillating frequencies within a first predefined frequency band;

transmitting and receiving intermediate local oscillating frequencies within a second predefined frequency band;

demultiplying a reference frequency signal and decreasing the intermediate local oscillating frequency for a prescribed number of iterations by an amount defined by a first frequency as a channel designation is sequentially increased;

demultiplying the transmitted intermediate local oscillating frequencies by ½; and demultiplying the received intermediate local oscillating frequencies by ¼.

16. The method as claimed in claim 15, wherein the first predefined frequency band is 22509.05–2289 MHz.

17. The method as claimed in claim 15, wherein the second predefined frequency band is 2320.05–2350 MHZ.

18. The method as claimed in claim 16, wherein the transmitting and receiving intermediate local oscillating frequencies are 548.05 MHZ and 548.1 MHZ, respectively, for odd channels, and 548 MHZ for even channels.

* * * * *